United States Patent
Iles et al.

(10) Patent No.: US 6,951,819 B2
(45) Date of Patent: Oct. 4, 2005

(54) HIGH EFFICIENCY, MONOLITHIC MULTIJUNCTION SOLAR CELLS CONTAINING LATTICE-MISMATCHED MATERIALS AND METHODS OF FORMING SAME

(75) Inventors: Peter A. Iles, Arcadia, CA (US); Frank F. Ho, Yorba Linda, CA (US); Yea-Chuan M. Yeh, Santa Monica, CA (US)

(73) Assignee: Blue Photonics, Inc., Walnut, CA (US)

( * ) Notice: Subject to any disclaimer, the term of this patent is extended or adjusted under 35 U.S.C. 154(b) by 0 days.

(21) Appl. No.: 10/728,103

(22) Filed: Dec. 4, 2003

(65) Prior Publication Data

US 2004/0166681 A1 Aug. 26, 2004

Related U.S. Application Data

(60) Provisional application No. 60/431,334, filed on Dec. 5, 2002.

(51) Int. Cl.[7] ............................................. H01L 21/302
(52) U.S. Cl. ..................... 438/705; 438/718; 438/745; 438/752; 438/753
(58) Field of Search ................................ 438/689, 705, 438/718, 745, 752, 753

(56) References Cited

U.S. PATENT DOCUMENTS

| 3,907,595 | A | | 9/1975 | Lindmayer |
| 6,252,287 | B1 | * | 6/2001 | Kurtz et al. ................ 257/461 |
| 6,278,054 | B1 | | 8/2001 | Ho et al. |
| 6,316,715 | B1 | | 11/2001 | King et al. |
| 6,340,788 | B1 | * | 1/2002 | King et al. ................. 136/261 |

(Continued)

OTHER PUBLICATIONS

Venkatasubramanian, et al., *An Inverted–Growth Approach to Development of an IR–Transparent, High–Efficiency AJGaAs/GaAs Cascade Solar Cell*, Conference Record of the 22$^{nd}$ IEEE Photovoltaic Specialists Conference, 1991, pp. 93–98.

(Continued)

Primary Examiner—Nadine G. Norton
Assistant Examiner—Binh X. Tran
(74) Attorney, Agent, or Firm—Knobbe, Martens, Olson & Bear, LLP

(57) ABSTRACT

In one embodiment, a method of forming a multijunction solar cell having lattice mismatched layers and lattice-matched layers comprises growing a top subcell having a first band gap over a growth semiconductor substrate. A middle subcell having a second band gap is grown over the top subcell, and a lower subcell having a third band gap is grown over the middle subcell. The lower subcell is substantially lattice-mismatched with respect to the growth semiconductor substrate. The first band gap of the top subcell is larger than the second band gap of the middle subcell. The second band gap of the middle subcell is larger than the third band gap of the lower subcell. A support substrate is formed over the lower subcell, and the growth semiconductor substrate is removed. In various embodiments, the multijunction solar cell may further comprise additional lower subcells. A parting layer may also be provided between the growth substrate and the top subcell in certain embodiments. Embodiments of this reverse process permit the top and middle subcells to have high performance by having atomic lattice spacing closely matched to that of the growth substrate. Lower subcells can be included with appropriate band gap, but with lattice spacing mismatched to the other subcells. The reduced performance caused by strain resulting from mismatch can be mitigated without reducing the performance of the upper subcells.

24 Claims, 10 Drawing Sheets

U.S. PATENT DOCUMENTS

| | | | |
|---|---|---|---|
| 6,482,672 B1 * | 11/2002 | Hoffman et al. | 438/94 |
| 6,534,797 B1 * | 3/2003 | Edmond et al. | 257/97 |
| 6,670,544 B2 * | 12/2003 | Kibbel et al. | 136/261 |
| 6,743,974 B2 * | 6/2004 | Wada et al. | 136/255 |
| 6,765,238 B2 * | 7/2004 | Chang et al. | 257/104 |
| 2001/0018924 A1 | 9/2001 | Hisamatsu et al. | |
| 2002/0117675 A1 | 8/2002 | Mascarenhas | |

OTHER PUBLICATIONS

Zahler, et al., *Wafer Bonding and Layer Transfer Processes for 4-Junction High Efficiency Solar Cells,* In: Conference Record of the 29$^{th}$ IEEE Photovoltaic Specialists Conference, IEEE, New York, May 19–24, 2002, pp. 1039–1042.

* cited by examiner

HIGH EFFICIENCY, MONOLITHIC MULTIJUNCTION SOLAR CELLS CONTAINING LATTICE-MISMATCHED MATERIALS AND METHODS OF FORMING SAME

PRIORITY APPLICATION

This application claims priority under 35 U.S.C. §119(e) from U.S. Provisional Patent Application No. 60/431,334, entitled "Method for Forming a High Efficiency Monolithic Multijunction Solar Cell Containing Lattice-Mismatched Materials" filed Dec. 5, 2002, which is hereby incorporated by reference herein in its entirety.

BACKGROUND OF THE INVENTION

1. Field of the Invention

This invention relates in one embodiment to a high efficiency monolithic multijunction solar cell comprising lattice-mismatched materials, and a method for making the same.

2. Description of the Related Art

To date, the highest conversion efficiency achieved for monolithically-grown, series-connected multijunction solar cells has been obtained using semiconductors with atomic lattice spacing closely matched to that of the growth substrate. In particular, the highest conversion efficiency multijunction solar cells have been formed using Group III–V semiconductors with appropriately sequenced band gaps, grown monolithically with atomic lattice spacing closely matched to that of a substrate, either GaAs or Ge. The semiconductors and band gaps used to date include $Ga_{(x)}In_{(1-x)}P$, where x is about 0.5, for a band gap range of about 1.85 to 1.9 eV for the top subcell (the subcell on the front surface of the cell); InGaAs, where the In content is low, giving a band gap range about 1.38 to 1.43 eV for the mid subcell; and Ge, with a band gap of about 0.66 eV for the lower subcell.

Theoretical calculations show that if the Ge subcell could be replaced with a subcell using material with band gap in the range of about 0.95 to 1.05 eV, higher efficiencies are attainable because of more effective use of the incident solar spectrum. Attempts to grow lower subcells in this band gap range on a GaAs or Ge substrate have not been successful, because the lattice-mismatch, about 2% with compounds like $In_{(x)}Ga_{(1-x)}As$ where x~0.3, reduced the quality and performance of the lower subcell. The lattice mismatch also degraded the performance of the upper subcells even if attempts were made to compensate for the lattice mismatch.

Several schemes have been used to minimize the lattice-mismatch, including the growth of lower subcells comprising $in_{(x)}Ga_{(1-x)}As$ layers with x graded from 0 to about 0.3, or by varying temperature schedules during growth of the lower and upper subcells to reduce the mechanical strains caused by the mismatch. Inclusion of additional elements such as nitrogen or boron in the InGaAs in the lower subcell maintained the band gap and changed the lattice spacing to match the substrate, but the added elements led to very poor electronic quality. The decreased current density in the series-connected subcells severely limited the cell performance, even if the upper subcells had good performance.

What is needed are methods for dealing with the lattice mismatch of lower subcells and improving the efficiency of solar cells.

SUMMARY OF THE INVENTION

Various preferred embodiments of this invention involve growing a plurality of subcells comprising a solar cell in a reverse sequence. High band gap subcells can be grown lattice-matched on a substrate such as for example GaAs or Ge. Low band gap subcells can be grown on the high band gap subcells. Lattice mismatch between the low band gap subcell(s) and the high band gap subcells, as well as the substrate, may exist. In such embodiments, high efficiency multijunction solar cells can be grown using high band gap subcells that are lattice-matched to the substrate and that achieve high efficiency, combined with lower band gap subcells that have lattice spacings mismatched to the high band gap material layers.

Another preferred embodiment of the invention comprises a method of forming a multijunction solar cell comprising an upper subcell, a middle subcell, and at least one lower subcell. In this method, a growth semiconductor substrate is provided for the epitaxial growth of semiconductor material. The upper subcell is formed over the growth semiconductor substrate such that the upper subcell has a first, upper band gap and is substantially lattice-matched to the growth substrate. The middle subcell is formed over the upper subcell such that the middle subcell is substantially lattice-matched to the growth substrate and the middle subcell has a second middle band gap. The first upper band gap is larger than the second middle band gap. The at least one lower subcell is formed over the middle subcell such that the at least one lower subcell is substantially lattice-mismatched with respect to the growth substrate and such that the at least one lower subcell has a third lower band gap. The third lower band gap is smaller than the second middle band gap. A support structure is provided over the substantially lattice-mismatched lower subcell and the growth semiconductor substrate is removed. Electrical contacts may be formed to the upper subcell and to the support structure and a coverglass may be placed in front of this upper subcell. Accordingly, light passing through the coverglass and incident on the upper subcell that pass through the subcells beneath generates electrical energy that is output by the solar cell.

Another embodiment of the invention comprises a multijunction solar cell for converting solar energy into electrical power having substantially unstrained subcells and substantially lattice-mismatched and strained subcells. The multijunction solar cell includes a support structure having lateral spatial extent and sufficient rigidity for providing structural support for a plurality of layers of material forming the solar cell. The support structure includes a metal surface across the lateral spatial extent of the support structure for reflecting light that passes through the layers of material and reaches the support structure. At least one lower subcell comprising semiconductor material is disposed over the metal surface of the support structure. The lower subcell has a first lower band gap. A middle subcell comprising semiconductor material disposed over the lower subcell. The middle subcell has a second middle band gap. The first lower band gap is smaller than the second middle band gap. An upper subcell comprising semiconductor material is disposed over the middle subcell. The upper subcell has a third, upper band gap. The third upper band gap is larger than the second middle band gap. The upper subcell and the at least one lower subcell are substantially lattice-mismatched and the lower subcell is more strained than the upper subcell. In various embodiments, the middle subcell and the at least one lower subcell may be substantially lattice-mismatched and the lower subcell may be more strained than the middle subcell.

Another embodiment of the invention comprises a method of forming a multijunction solar cell comprising a high band gap substantially unstrained subcell and at least one lattice-mismatched low band gap subcell. The method comprises providing a growth semiconductor substrate for the epitaxial growth of semiconductor material and forming the high band gap subcell over the growth semiconductor substrate. The high band gap subcell has a first high band gap. The at least one low band gap subcell is formed over the high band gap subcell. The low band gap subcell has a second low band gap. The first high band gap is larger than the second low band gap. The growth substrate and the second low band gap subcell have substantial lattice mismatch. A support structure is provided over the lower band gap subcell and the growth semiconductor substrate is removed. The support structure may be disposed on one or more layers formed on the lower band gap subcell.

Another embodiment of the invention comprises a multijunction solar cell for efficiently converting solar radiation into electrical power having lattice-matched subcells. The multijunction solar cell comprises a support structure having lateral spatial extent and sufficient rigidity for providing structural support for a plurality of layers of material forming the solar cell. The support structure includes a metal surface across the lateral spatial extent of the support structure for reflecting light that passes through the layers of material and reaches the support structure. At least one low band gap lattice-mismatched subcell comprising semiconductor material is disposed over the metal surface of the support structure. The low band gap subcell has a low band gap. A high band gap subcell comprising semiconductor material is disposed over the low band gap subcell. The high band gap subcell has a high band gap, which is larger than the low band gap. The lattice-mismatched low band gap subcell is substantially lattice-mismatched with respect to the upper subcell. This multijunction solar cell may further comprise a middle subcell. This middle subcell may be lattice-matched to the upper subcell in certain embodiments. The at least one low band gap subcell may include first and second lower subcells. Each of these first and second lower subcells may be substantially lattice-mismatched with respect to the upper subcell. Accordingly, the solar cell may comprise three or four junction in different embodiments.

Another embodiment of the invention comprises a multijunction solar cell having a high AM0 conversion efficiency at 28° C. and both lattice-mismatched subcells and substantially unstrained subcells. The multijunction solar cell comprises a support structure having lateral spatial extent and sufficient rigidity for providing structural support for a plurality of layers of material forming the solar cell. At least one lower lattice-mismatched subcell comprising semiconductor material is disposed over the support structure. The lower subcell has a lower band gap. A substantially unstrained upper subcell comprising semiconductor material is disposed over the lower subcell. The upper subcell has an upper band gap. The upper subcell band gap is larger than the lower subcell band gap. The lattice-mismatched subcell is substantially lattice-mismatched with respect to the substantially unstrained upper subcell and the substantially unstrained upper subcell has sufficiently low strain such that the AM0 efficiency of the solar cell is at least about 30%. The AM0 efficiency for the upper subcell may be at least about 25%. Other embodiments are possible as well.

In certain non-limiting embodiments, the multijunction cell may be formed by growing the subcells in reverse order on, for example, a GaAs or Ge substrate. With this reverse growth process, the upper subcell(s) can be fabricated to have high performance by having atomic lattice spacing closely matched to that of the growth substrate. Lower subcells can be included with appropriate band gap, but with lattice spacing mismatched to the other subcells. Similarly, the upper cell(s) can have performance that is adjusted or optimized, while the lattice-mismatch in the lower subcell(s) can be addressed separately. The lower subcell(s), grown later than the upper two cells, can be separately tailored or optimized to provide the desired electrical output. Lattice-grading layers, e.g., of InGaAs, may be used as well as temperature-cycling to reduce strain. The internal design of the lower subcell(s) can also be appropriately selected or optimized, in layer thicknesses, and impurity concentrations and gradients.

DETAILED DESCRIPTION OF THE PREFERRED EMBODIMENTS

Figure 1:
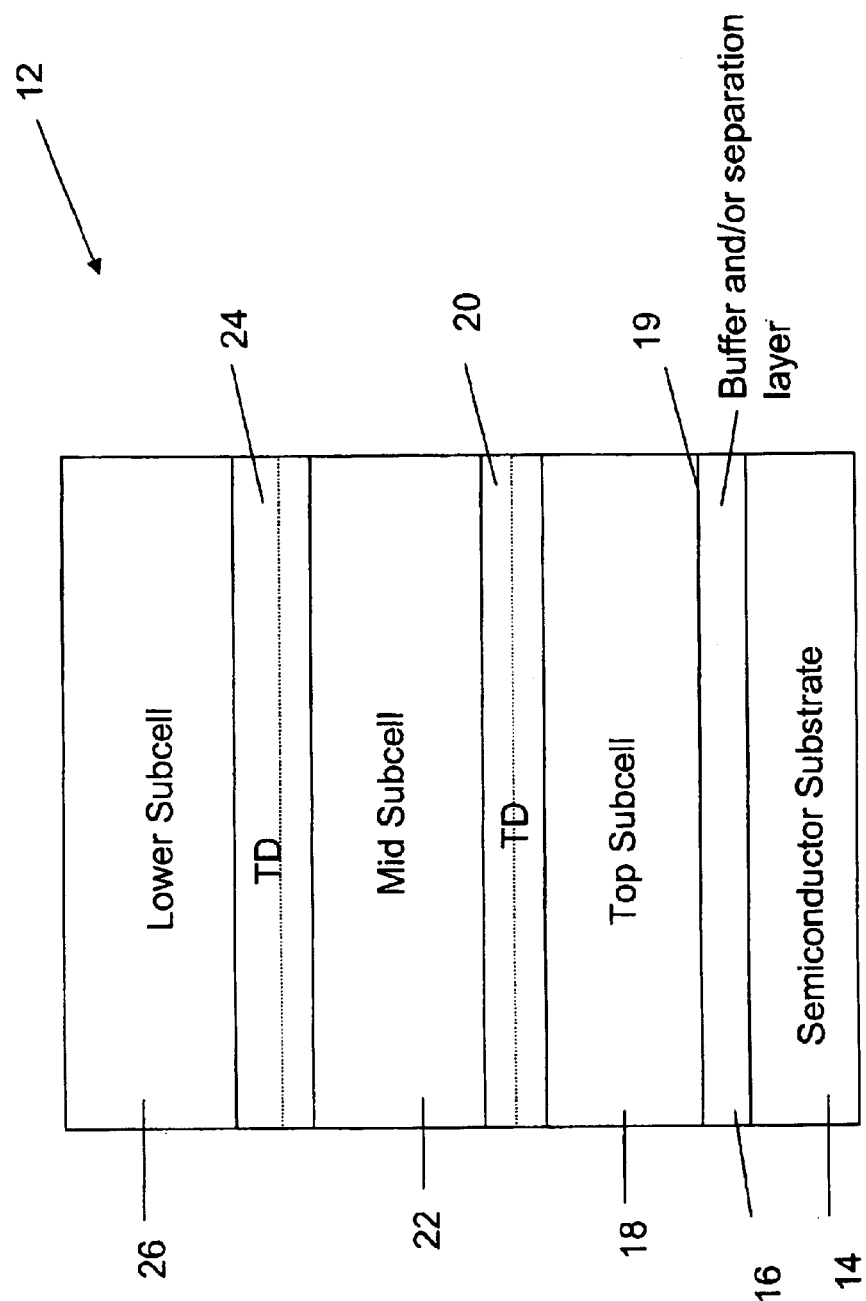
FIG. 1 illustrates an epitaxial growth layer sequence to form a multijunction solar cell according to one embodiment of the present invention.

Multi-junction solar cells may comprise a plurality of subcells that convert solar radiation into electrical energy. In various preferred multi-junction solar cells, the different subcells absorb different spectral components of the solar spectrum such that a large portion of the spectrum is absorbed. In this manner, the conversion of optical energy into electrical energy is thereby increased.

The subcells preferably comprise semiconductor material having different band gaps with correspondingly different spectral absorption cutoff wavelengths. The plurality of subcells are preferably stacked such that light is absorbed by each of the subcells. In particular, in certain embodiments, higher band gap layers are stacked on lower band gap layers such that shorter wavelength light is absorbed by the higher band gap layers and longer wavelengths are transmitted therethrough. These longer wavelengths are absorbed by the lower band gap layers beneath the higher band gap layers.

Growing the layers of different semiconductor material that form the subcells, however, may be difficult. In particular, certain materials with preferred spectral characteristics are difficult to epitaxially grow on suitable substrates as described above. Other semiconductor materials may be epitaxially grown more easily. In certain cases, for example, some higher band gap materials may be epitaxially grown on suitable semiconductor substrates, such as GaAs and Ge. These layers may be substantially lattice-matched and consequently generally unstrained. Other materials layers that exhibit lower band gaps may be difficult to grow without substantial lattice mismatch and corresponding strain. It will be appreciated that one skilled in the art understands the meaning and significance of lattice mismatch, lattice-matched, strained and unstrained layers. As described above, for example, growing the upper band gap layers on the lattice-mismatched lower band gap layers results in lattice mismatch of the upper band gap layers as well. A poorly fabricated inefficient device may result.

Various preferred embodiments of this invention involve growing a plurality of subcells comprising a solar cell in a reverse sequence. The higher band gap subcells may be grown on the semiconductor growth substrate, preferably with negligible lattice mismatch. The lower band gap subcells, which are likely to be lattice-mismatched may be grown on the higher band gap subcells. With this approach, preferably the reduced performance when the subcell with lattice imperfections was grown first can be decreased, minimized, or substantially avoided.

With the reverse growth process wherein the upper subcells are grown on the substrate and the lower subcells are grown over the upper subcells, the upper subcells can be lattice-matched to the substrate with the appropriate selection of materials. Advantageously, materials with suitable high band gap are available that have substantially the same atomic spacing as preferred substrates such as GaAs and Ge. In contrast, various materials having relatively low band gaps do not have atomic spacing substantially the same as such substrates like for example GaAs and Ge. Formation of these low band gap materials over the substrate will in general result in substantial lattice mismatch. This lattice mismatch may be, for example, at least 1%, possibly 2% or more, or 4% or large. Values of 5% or higher are also possible.

Lattice mismatch corresponds to the difference in the lattice spacing of two layers of material, such as for example, the lower subcell and the upper subcell or the lower subcell and the substrate. A lattice mismatch of 1% means that the difference in lattice spacing is about 1% the lattice spacing of one of the layers. Gallium arsenide (GaAs) and germanium (Ge) substrates generally have an atomic spacing of about 5.65 Angstroms (A). Accordingly, a layer of material that is that has about 1% lattice mismatch with respect to a GaAs or Ge substrate may have a lattice constant or atomic spacing of about 5.71. Similarly, a layer having an atomic spacing of about 5.76 would have a lattice mismatch of about 2%. Accordingly, the ratio of 5.76 to 5.65 approximately yields 1.02 or 102%, the difference in percent being about 2%.

Table I below lists the difference in atomic spacing between a GaAs or Ge substrate and another layer for various values of lattice mismatch. These values are only approximate and represent examples of different atomic spacings for different layers. Of course, the atomic spacing of the layer could be larger or smaller than the atomic spacing of the substrate and result in lattice mismatch. Also, although the lattice spacing of a layer is compared with a substrate in the lattice mismatch examples listed in the Table, lattice mismatch may also exist between two layers. In particular, in the case where one of the layers is lattice-matched to the substrate and another layer is lattice-mismatched with respect to the substrate, the two layers will also in theory be lattice-mismatched.

Lattice mismatch may result in strain. A subcell that is mismatched to the substrate may therefore exhibit strain whereas a subcell that is lattice-matched may be unstrained. It will be appreciated that one skilled in the art can determine and identify strained and unstrained layers. Disadvantageously, strain may degrade performance of the subcell and may for example hamper efficient conversion of optical radiation incident on the subcell into electrical power. Similarly, reduced strain may be correlated with increased efficiency, output, and performance.

Preferably, various embodiments of the reverse growth process described herein enable unstrained lattice-matched layers comprising high band gap material to be combined with low band gap material in strained lattice-mismatched layers. In particular, embodiments of this reverse process permit the upper subcell(s) to have high performance by having atomic lattice spacing closely matched to that of the growth substrate. Lower subcell(s) can be included with appropriate band gap, but with lattice spacing mismatched to the other subcells.

TABLE I

| Lattice Mismatch (percent) | Atomic Spacing Substrate (Angstrom) | Atomic Spacing Layer (Angstrom) | Difference in Atomic Spacing (Angstrom) |
| --- | --- | --- | --- |
| 1% | 5.65 | 5.71 | 0.06 |
| 2% | 5.65 | 5.76 | 0.11 |
| 3% | 5.65 | 5.82 | 0.17 |
| 4% | 5.65 | 5.875 | 0.225 |
| 5% | 5.65 | 5.93 | 0.28 |

FIG. 1–6 illustrate various aspects of reverse growth. FIG. 1 shows an intermediate product 12 corresponding to the main structures grown to form a three subcell device with preferred or optimum band gap sequence. A substrate 14 is provided for epitaxial growth thereon. A buffer and/or separation layer 16 is preferably formed on the semiconductor substrate 14 although the buffer/separation layer may not be required in certain embodiments. In various preferred embodiments, for example, the growth substrate may comprise GaAs and the buffer and/or separation layer may comprise AlGaAs or AlAs. A top or upper subcell 18 is shown disposed over the substrate 14 and is formed on the buffer and/or separation layer 16 in this embodiment. (The subcells 18 are named in the order they have in a final cell 10 shown in FIG. 6, wherein the sunlight enters at a surface 19 on the top cell.) A tunnel diode 20 is formed on the top subcell 18. The tunnel diode 20 may be excluded in other embodiments. Other structure may be included in the alternative or in addition to the tunnel diode 20 in different designs. A middle subcell 22 is disposed over the top subcell 18 and is formed on the tunnel diode 20 on the top subcell. Another tunnel diode 24 is formed on the middle subcell 22. Again, this tunnel diode 24 may be excluded in certain embodiments and substituted or supplemented with additional structure depending on the design. A lower subcell 26 is formed over the middle subcell 22 and on the tunnel diode 24 formed on the lower subcell in this case.

As described above, the subcells 18, 22, 26 are named in the order they have in the final cell 10. See FIG. 6. In operation, solar radiation is directed onto the solar cell 10 and incident on the top surface 19 of the top subcell 18 where a portion is absorbed. The remainder or at least a substantial portion thereof preferably continues onto the middle subcell 22 again where a portion of the light is absorbed. At least a substantial portion of the light not absorbed by either the top subcell 18 or the middle subcell 22 preferably continues onto the lower subcell 26 where a portion, preferably the remainder of the light is absorbed. All the radiative energy in the solar emission will likely not be absorbed in this single pass through the three subcells 18, 22, 26. Techniques for improving absorption by providing another pass are described more fully below.

In one embodiment, the top subcell 18 has a band gap range of about 1.80 to 2.1 eV, and is more preferably made of a material such as $Ga_{(x)}In_{(1-x)}P$, where x is about 0.5. The middle subcell 22 preferably has a band gap range of about 1.38 to 1.43 eV, and is more preferably made of a material such as InGaAs, where the In content is low. For example, the middle subcell may comprise $In_{(x)}Ga_{(1-x)}As$ where x is equal to about 0.01. The lower subcell 26 preferably has a band gap range of about 0.95 to 1.05 eV, and is more preferably made of $In_{(x)}Ga_{(1-x)}As$ where x is about 0.25 or 0.35. Values outside these ranges as well as other materials can be used in other embodiments.

As shown in FIG. 1, in the reverse growth sequence the semiconductor substrate 14, which may comprise e.g., GaAs or Ge, is used possibly with the inclusion of a parting layer 16 between the substrate and the top subcell 18. This semiconductor substrate 14 preferably provides structural support during the growth process and preferably enables epitaxial growth of the layers to be achieved. As discussed above, as well as more fully below, the layers closer to the semiconductor growth substrate 14, such as the top or upper layer 18 and the mid cell 22 are likely to have closer lattice matching to the semiconductor growth substrate and to the parting layer 16 than the layers farther from the semiconductor growth substrate such as the lower subcell 26. In various embodiments, for example, the lower subcell 26 preferably has at least 1% lattice mismatch. In other embodiments, the lattice mismatch may be about 2% or more, about 4% or more or about 5% or more or even greater. Values outside this range are also possible. Similarly, lattice mismatch may exist between the lower subcell 26 and the top subcell 18 and mid subcell 22. As a result of the lattice mismatch, the lower subcell 26 may be strained whereas the top and mid subcells 18, 22 are preferably unstrained and exhibit increased efficiency and output. Preferably, the parameters in the growth process as well as the composition of the material grown are selected to increase lattice matching, efficiency, and other performance goals such as for example, increased conductivity through the device as well as possibly to improve fabrication, for example, to simplify processing, increase yield, and reduce cost of fabrication.

Figure 2:
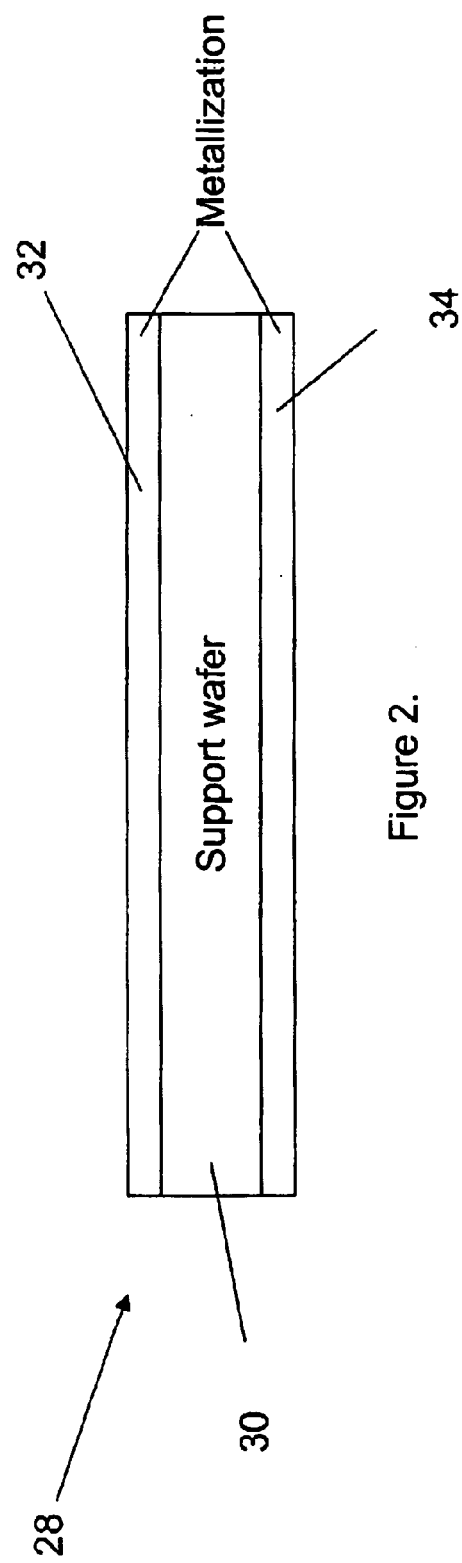
FIG. 2 illustrates a support substrate used to bond to the lower subcell of FIG. 1.

After the growth is completed, a support substrate 28 shown in FIG. 2 is bonded to the lower subcell 26 (possibly through one or more layers formed on the lower subcell in certain embodiments). In various preferred embodiments, the support substrate 28 comprises a support wafer 30 with layers of metallization 32, 34 on upper and lower sides thereof. This support wafer 30 may comprise for example silicon. Support substrates 28 comprising other materials may be also used. In addition, the support substrates 28 may comprise multi-layer structures and may have internal structures formed therein or thereon as discussed more fully below. The support substrate 28 may be between about 100 and 200 micrometers or microns ($\mu$m) thick. Support structures 28 having thicknesses outside this range are also possible. The support substrate 28 may be flexible in certain preferred embodiments. The metallization may comprise, for example conducting metals such as Cu, Ag, Au, and Al. The reflectance of these metals is high and does not substantially vary with wavelength and these metals are substantially resistant to radiation and proton bombardment to which space based cells may be exposed. The layers of metallization 32, 34 may be different on top and bottom and may comprise alloys or multilayers. Other types of layers comprising other materials, including other conductive layers are also possible. These layers 32, 34 may be between about 2 $\mu$m to about 6 $\mu$m thick. Other thicknesses are also possible. Preferably, however, one or both the layers 32, 34 are substantially reflective.

Figure 3:
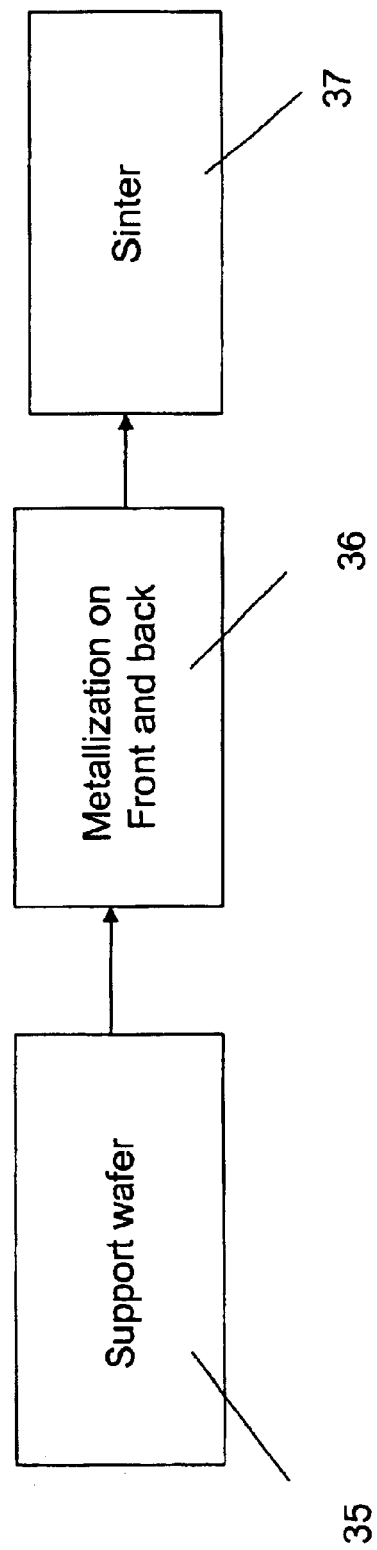
FIG. 3 illustrates the process steps used to form the support substrate of FIG. 2.

FIG. 3 shows the process steps used to form the support substrate 28 with layers of metallization 30, 32 on top and bottom. As represented by blocks 35 and 36, the support wafer is metallized on front and back. Sintering as indicated by block 37 may be employed as well to increase adhesion of the metals to the substrate.

Figure 4:
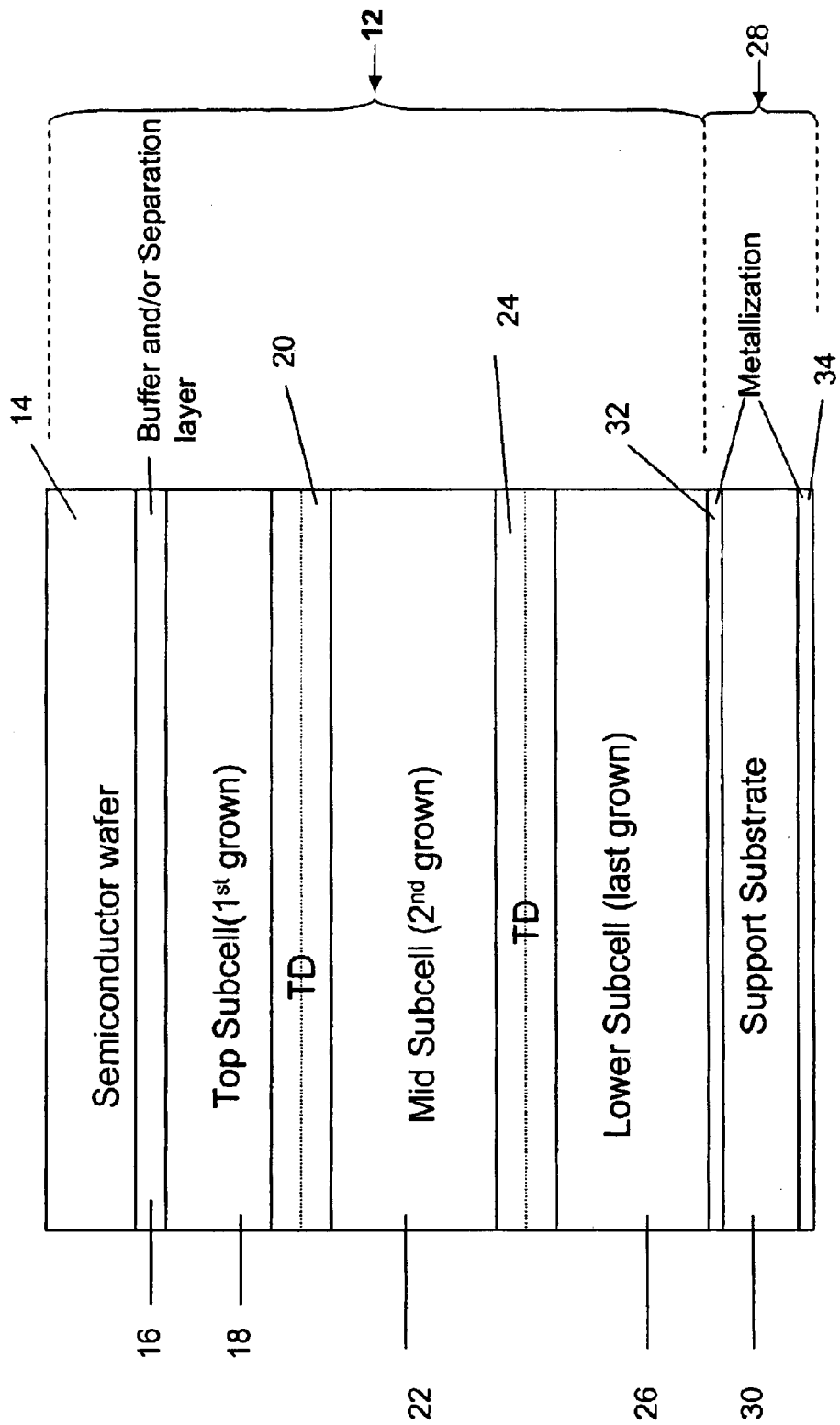
FIG. 4 illustrates the bonding of the support substrate of FIG. 2 with the solar cell structure of FIG. 1.

As shown in FIG. 4, the support substrate 28 is bonded to the grown cell structure 40 comprising the top subcell 18, the middle subcell 22, and the lower subcell 26 affixed to the semiconductor growth substrate 14. As illustrated, the top subcell 18 is close to the growth substrate 14 whereas the lower subcell 26 is the farther from the growth substrate. As discussed above, in the reverse growth process, the top subcell 18 is grown prior to the lower subcell 26. The support substrate 28, however, is bonded to the lower subcell 26 or one or more layers formed thereon on a side opposite to the top subcell 18. Such bonding may be accomplished by metallization, however other methods of affixing the support substrate 28 to the grown cell structure 40, for example, to the lower subcell 26 or one or more layers formed on the lower subcell are possible. In the case where the metallization is provided between the lower subcell 26 and the support substrate 28, preferably this metal layer 32 is a substantially effective reflector that directs light transmitted through the lower subcell 26 back through the subcells an additional time. The surface on which the metal layer 32 is formed is preferably substantially clean and substantial flat and such that the metal layer will be substantially reflective.

Figure 5:
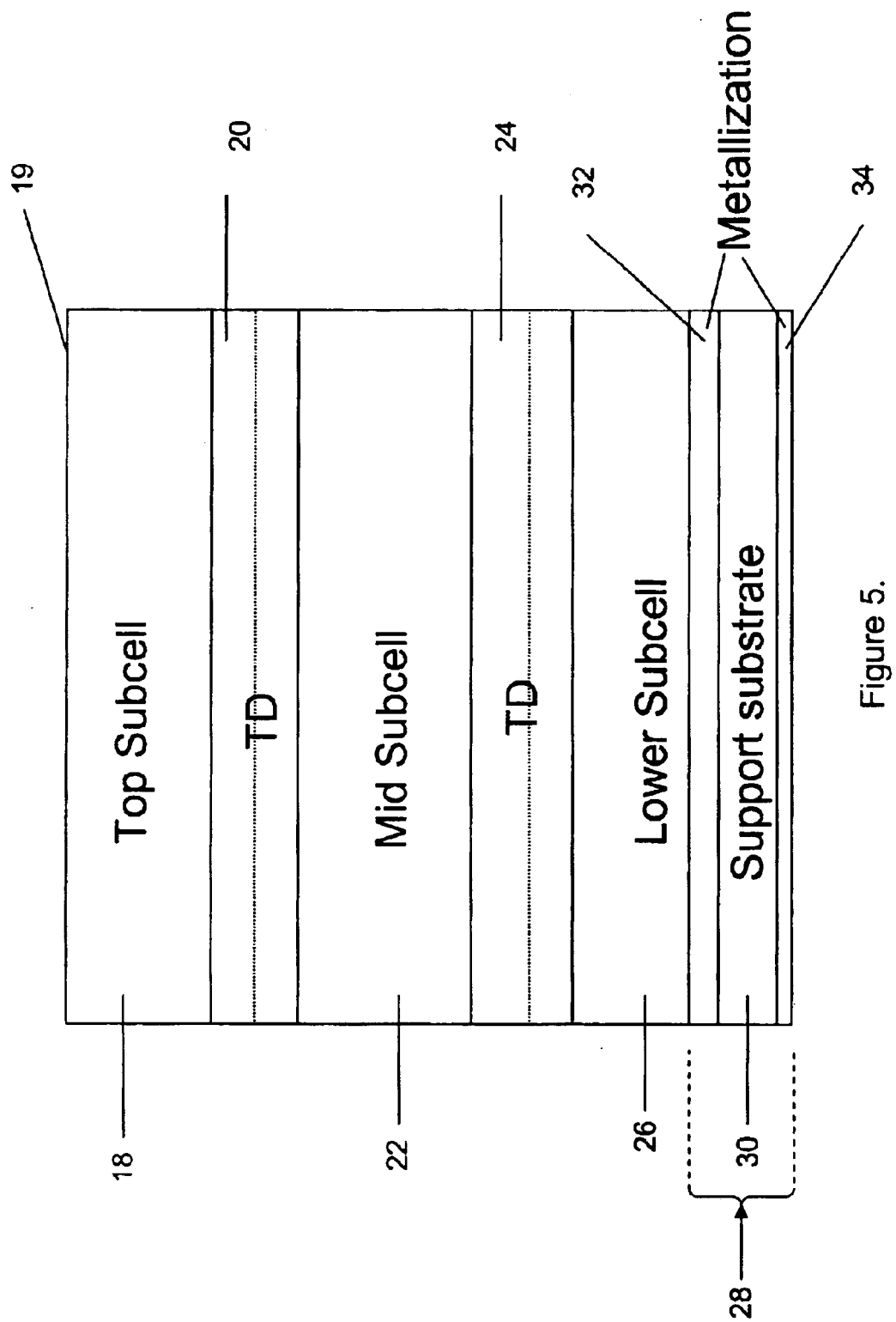
FIG. 5 illustrates the removal of the semiconductor growth substrate from the solar cell structure of FIG. 4.

Next, the growth substrate 14 is removed, as shown in FIG. 5. In certain embodiments, the original growth substrate 14 is available for use again, requiring very little preparation. For example, the parting layer 16 can be preferentially etched, to remove the original growth substrate 14. In various embodiments, for instance the parting layer 16 comprises AlAs and is preferentially etched using HF acid. Other approaches to removing the growth substrate 14 may also be used. The parting layer 16 may be omitted in certain embodiment, for example, if separation is not possible, or is very difficult over large areas. The substrate 14, which may preferably Ge in some embodiments, can be removed by chemical or vapor phase etching. An etch stop layer comprising, e.g., AlGaAs, can be provided to facilitate etching of the growth substrate 1, without affecting the active layers such as the subcells, 18, 22, 26 or other layers that contribute to efficiency or output level.

Figure 6:
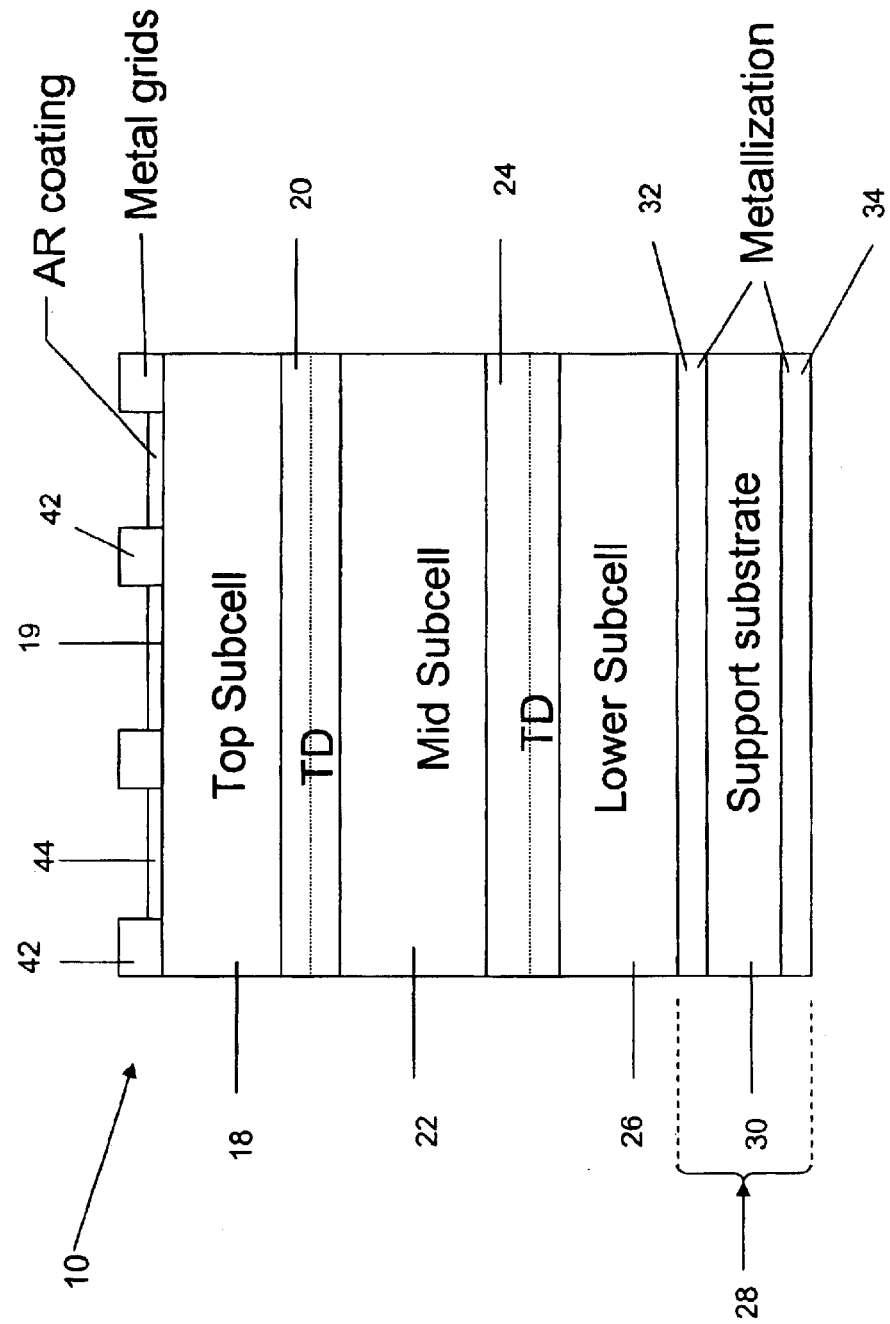
FIG. 6 illustrates one embodiment of the completed multijunction solar cell structure.

Contacts and optical and/or protective coatings can be added to the devices. FIG. 6 shows the addition of front surface metal grid contacts 42 and an antireflective (AR) coating 44. The contacts 42 and the AR coating 44 are disposed on the top subcell 18. The contacts 42 and the AR coating 44 may be formed on or in front of the top subcell 18 after the growth substrate 14 has been removed. Well-known deposition techniques may be used as well as fabrication processes yet to be developed. Other optical or electrical features may be added to the device 10 on the front face or elsewhere.

Additional features can be included in the device 10. For example, if a protective bypass diode is included in the multijunction cell, the appropriate layers can be grown during the reverse process for example before the top subcell layer 18 growth begins. Interconnecting contacts can be applied to the diode for example when the front contacts 42 are applied. Other features and structure may also be included in the device.

Figure 7:
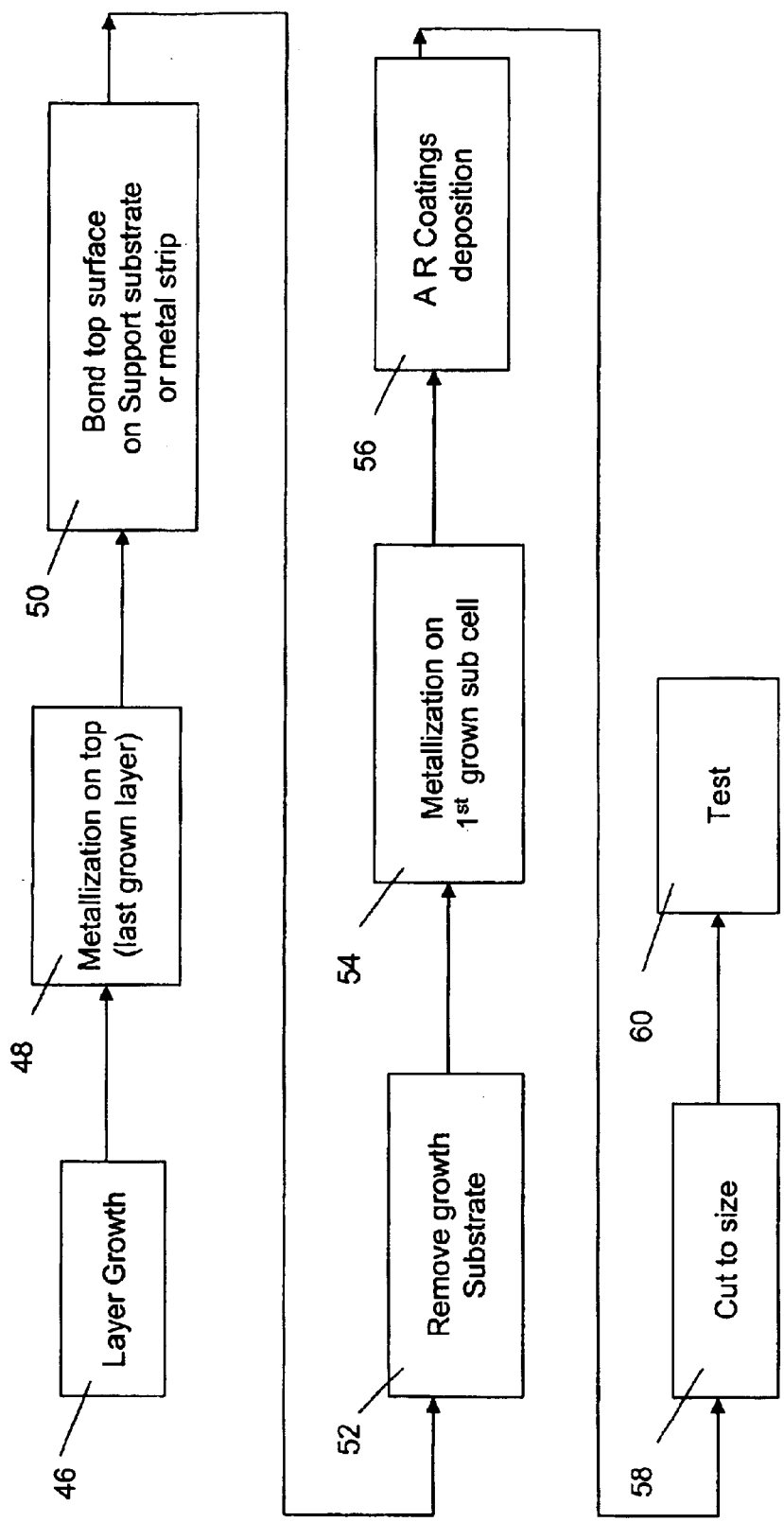
FIG. 7 illustrates a solar cell fabrication flow diagram according to one embodiment of the present invention.

FIG. 7 shows one preferred embodiment of a process sequence incorporating preferred steps described. Not all of these steps may be required in preferred embodiments of the present invention and additional ones may be added. The process steps can be altered as well. As shown in FIG. 7, layer growth represented by block 46 may be followed by formation of metallization on the lower subcell 26 or last layer grown as indicated in block 48. The support substrate 28 is bonded to the surface of the device corresponding to the lower subcell 26 or last grown layer with metallization thereon (see block 50). A metal strip may be formed in place of the support substrate 28 in various other embodiments. The growth substrate 14 is removed as represented by block 52. The first grown subcell 18 may therefore be exposed. Metallization for contacts 42 may be formed preferably in an optimized grid pattern on the first grown subcell 18, referred to above as the top or upper subcell (see block 54). Optical coatings such as the AR coating 44 may also be deposited as indicated in block 56. The device is preferably cut to size and may be tested as represented by blocks 58 and 60. As discussed above, this process may be varied. For example, the other techniques may be used to bond the support substrate 28 to the stack of subcells 18, 22, 26. Various types of support substrates 28 may also be employed.

The properties of the layers in the structure 10 are preferably controlled by the growth temperatures and times, and by use of appropriate composition and dopants. The use of a vapor deposition method (such as Organo Metallic Vapor Phase Epitaxy, OMVPE, Metal Organic Chemical Vapor Deposition, MOCVD, Molecular Beam Epitaxy, MBE, or other Vapor Deposition methods) for the reverse growth may enable the layers in the monolithic sequence forming the cell to be grown with the required thickness, elemental composition, dopant concentration and grading and conductivity type. Characterization techniques can be employed to determine preferred or optimum values for the layer thicknesses, dopant concentrations and gradients, and the elemental compositions, which may control the band gap values and the lattice spacing. Systematic iterative tests can be used to define the preferred or optimum blend of properties.

The proposed method can be applied to form cells with either p/n or n/p configuration, with suitable choice of the conductivity type of the growth substrate. If the growth substrate has the opposite conductivity type from that needed for the configuration of the p and n layer sequence in the cell, the method of inserting a reversing tunnel junction can be used.

The reverse growth process can be extended to form solar cells having more or less number of subcells than described above. The reverse growth process may for example be extended to form two-junction cells, four-junction cells, or other multiple-junction solar cells.

One advantage of various preferred methods described herein is that these methods permit the monolithic growth of a series-connected multijunction solar cell where the lower subcell(s) 26 can have a lattice spacing not matched to the growth substrate 14, and which can also be varied and optimized without affecting the performance of the upper subcells 18, 22. The lower subcell(s) 26 can be grown with the preferred or optimum band gap, and with the lattice spacing not matched to that of the growth substrate 14 or the upper two subcells 18, 22. Compared to GaAs or Ge, for example, the lattice-mismatch for $In_{0.3}Ga_{0.7}As$ is more than about 2.2% and the lattice mismatch for $In_{0.6}Ga_{0.4}As$ is more than about 4.4%. In certain embodiments, for example, the lower subcell 26 with composition such as $In_{0.4}Ga_{0.6}As$ or similar thereto, can be separately optimized by utilizing a different growth temperature and dopants from that used for the other subcells 18, 22. Growing the lower subcell(s) 26 in the later stages, after forming the upper subcell(s) 18, 22, also allows adjustment to the lattice mismatch by using appropriately graded inter-layers or different heating schedules, and special subcell design to improve the performance of the lower subcell(s) without affecting the performance of the other subcells. The higher band gap materials may, for example, be grown in the range of 650° to 750° C. To reduce or minimize strain from lattice-mismatch for the lower band gap materials such as InGaAs, growth temperatures may vary from 400° to 800° C., and annealing temperatures up to 900° C. may be used. Temperatures outside these ranges, however, may also be utilized.

The growth sequence is preferably appropriately designed to yield desirable or optimal properties of the various layers to assist forming a high efficiency cell. Appropriate layer thicknesses are preferably set by consideration of the optical absorption coefficients for the subcell semiconductor for incident wavelengths in the part of the solar spectrum transmitted through the subcells. The correct band gap sequence for three-junction or four-junction solar cells may be selected by modeling for example either air mass zero (AM0) or other solar spectra. The p-type and n-type regions of the subcells are preferably grown with the elemental composition that gives the optimum band gaps. The optimum dopant impurity concentrations and their gradients can be incorporated. Intermediate layers useful for high output such as for example back surface fields, tunnel junctions, impurity-confining layers, impurity concentrations or gradients, and others, can be grown into the multi-junction cell structure in reverse order in the growth process.

For instance, after the growth of the middle subcell 22 is complete, grading layers may be grown to reduce stress in the lower subcell 26 resulting from the mismatch in lattice spacing. In various exemplary embodiments, for example, grading layers of $In_xGa_{1-x}As$, with the content of In varying, e.g., x varying from about 0.01 to 0.3 or 0.3 to 0.6, may be included in the solar cell structure. Other ranges are possible as well.

In addition, tunnel junction layers 20, 24, 25 are preferably incorporated such as for example shown in FIG. 1 and 6 (and also in FIGS. 8 and 9 discussed more fully below) to provide low resistance interconnection between the subcells. The tunnel junctions 20, 24, 25 preferably comprise very highly doped p++ and n++ layers, with very steep impurity gradients to reduce or minimize the thickness of the junction depletion region. The band gaps of the tunnel junction layers are selected to be higher than those of the subcell under the tunnel junction 20, 24, 25 and the tunnel junction layers are made very thin to reduce or minimize absorption of wavelengths which could provide useful carriers in lower subcells. To maintain the abrupt impurity concentration gradient in the tunnel junctions 20, 24, 25 wide band gap confining layers can be grown above and below each tunnel junction. To reduce loss of charge carriers by recombination at the internal interfaces and the external surfaces, passivating layers are formed during growth. The passivating layers are either window layers formed from semiconductors with band gap higher than that of each subcell under it, or are back surface fields, produced by grading the impurity dopant or band gap. The reverse growth sequence may enable optimization of properties in the various layers in the solar cell to assist forming a high efficiency cell.

As described above, the lower subcell(s) 26 can be incorporated with the desired band gap range, lattice-mismatched to the substrate lattice. These lower subcell(s) 26 may exhibit strain. Preferably, however, these lower subcell(s) 26 can be grown without substantially reducing the performance of the upper subcell(s) 18, 22, which for certain triple junction solar cell accounts for around 84% of this cell output. As the upper subcells 18, 22 contribute to most of the output, the upper subcells are preferably substantially unstrained and the performance of the upper subcells is preferably not hindered by strain. Accordingly, the upper subcells 18, 22 are preferably lattice-matched to reduce such strain that may negatively affect output, efficiency, and performance. Preferably, the substantially lattice-matched upper layers 18, 22 possess less than about 1% lattice mismatch (99% lattice-matched) or preferably not more than about 0.5% lattice mismatch (99.5% lattice-matched) or preferably not more than 0.1% lattice mismatch (99.9% lattice-matched). Less than about 0.05% lattice mismatch (99.95% lattice-matching) and less than about 0.01% lattice mismatch (99.99% lattice-matching) are also preferred, although other values are possible. As indicated above, determinations of lattice matching can be made by one skilled in the art. The reverse growth process wherein the upper subcells 18, 22 are grown over the substrate prior to growth of the lower subcell(s) 26 preferably reduces lattice mismatch that would otherwise be imparted on the upper subcells from growth of underlying lattice-mismatched lower subcell layers. As a result, the upper subcells 18, 22 preferably have substantially less strain than the lower subcell(s) 26. In various embodiments, the lower subcell(s) 26 can be designed or optimized to accommodate the lattice strains. Current density can thereby be increased. Moreover, as described above, degradation of the performance of the other subcells, e.g., the upper and middle subcells 18, 22, which are grown lattice-matched to the growth substrate 14, can be reduced or minimized.

The processing sequence used with the reverse growth potentially offers some additional advantages, including use of a re-usable growth substrate 14, the possibility of using a support substrate 28 which reduces the weight of the cell and increases transfer of heat from the cell, and the ability to providing a back metallized contact with high reflectance. As described above, for example, the support substrate 28 can be a rigid, light weight wafer 30, such as silicon, metallized on both faces, to provide a back contact on one face, and on the opposite face to allow bonding to the lower subcell 26, along with high reflectance. In other embodiments, the support substrate 28 may also be a thin polished wafer of copper, possibly coated to provide very high optical reflectance, along with low electrical resistance and high thermal conductance. Such coatings may comprise one or more layers of metal such as Ag, Au, Al, or Cu. Preferably this metal wafer is polished and provides increased reflectivity. Other variations are possible.

The high back surface reflectance (BSR) can increase current through the lower subcell(s) 26 by recycling photons which would normally be lost, leading to increased absorption and conversion into electrical energy. The high BSR may also advantageously reflect more energy at wavelengths greater than the band edge cut-off wavelength of the subcell closest to the reflective surface. The resulting increase in solar absorptance lowers the operating temperature of the cell in space, for example, by about 15 degrees Celsius, thereby boosting the power output over that of the conventional multijunction cells.

Embodiments of the completed cell could lead to practical air mass zero (AM0) conversion efficiencies for a cell operating around 30 degrees Celsius, in the range of about 30 to 31%. This efficiency is significantly higher than the ultimate efficiency of the triple junction cell, InGaP/GaAs/Ge, operated under the same conditions. The bonding of the doubly metallized support substrate can reduce the cell weight and offers a further increase of about 1% in air mass zero (AM0) conversion efficiency, because of the high BSR possible.

As described above, the reverse growth sequence preferably involves removal of the growth substrate 14. In various preferred embodiments, the growth substrate 14 may be removed in a manner such that the growth substrate may be reused. For example, parting layers 16 can be grown to facilitate removal of the support substrate 14 substantially intact so as to allow re-use of the substrate. The option of a reusable growth substrate 14 may thereby reduce the substrate cost.

In addition, the support substrate 28 can be designed to reduce cell weight, and to increase the reflectance at the back surface. As described above, the high back surface reflectance provides photon recycling which increases the current in the lower subcell 26, and by lowering the solar absorptance, reduces the operating temperature of the cell when operating in space. The reduced temperature could increase cell output by about 3 to 4% over conventionally grown cells. These advantages are preferably retained if the multijunction cells are operated under concentrated sunlight. The support substrate 28 can also increase heat transfer from the solar cells, both by the BSR increasing radiation which may be particularly useful for example in space applications or by conduction to a heat sink, which may be useful for example in terrestrial applications.

Figure 8:
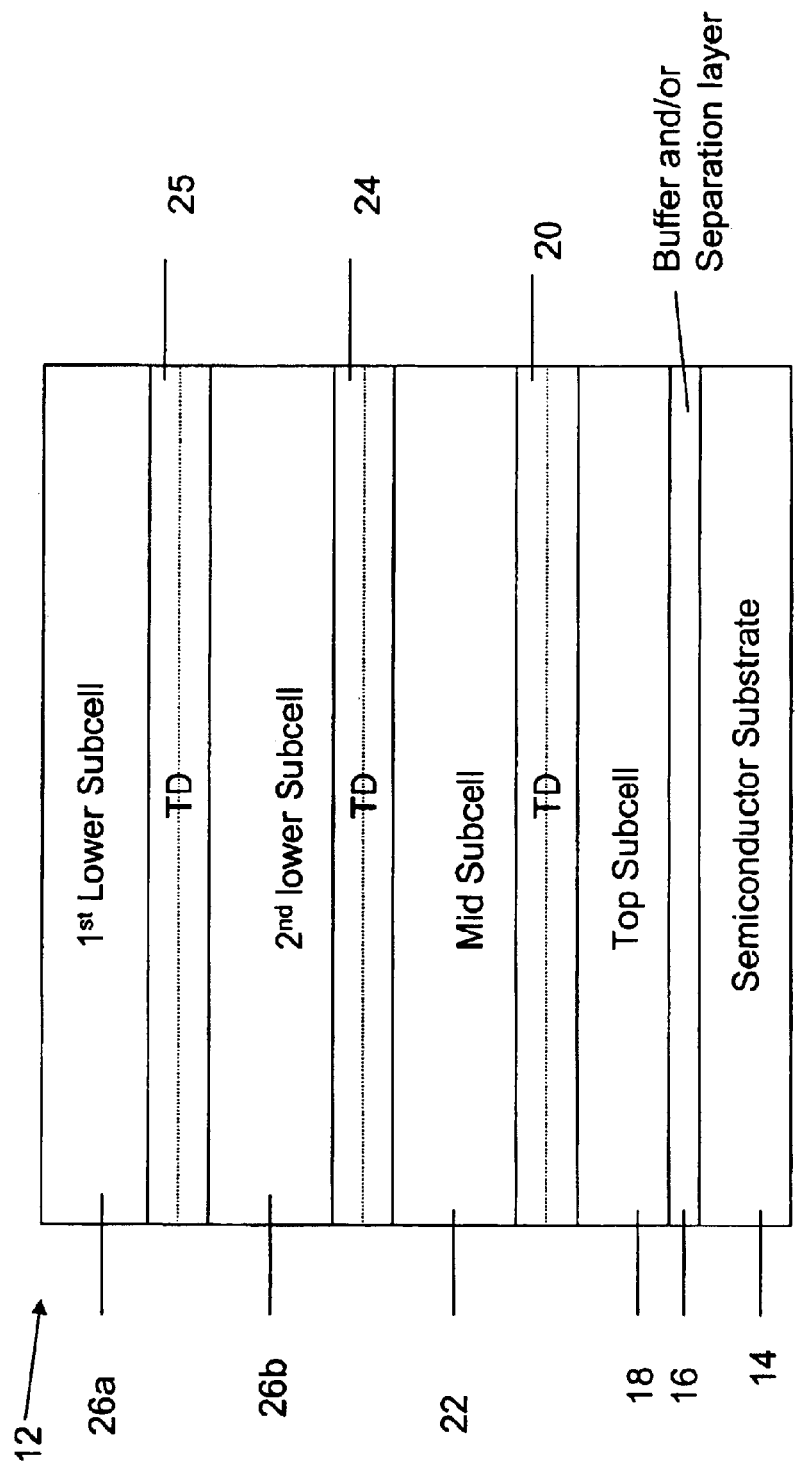
FIG. 8 illustrates an epitaxial growth layer sequence to form a multijunction solar cell comprising first and second lower subcells.
Figure 9:
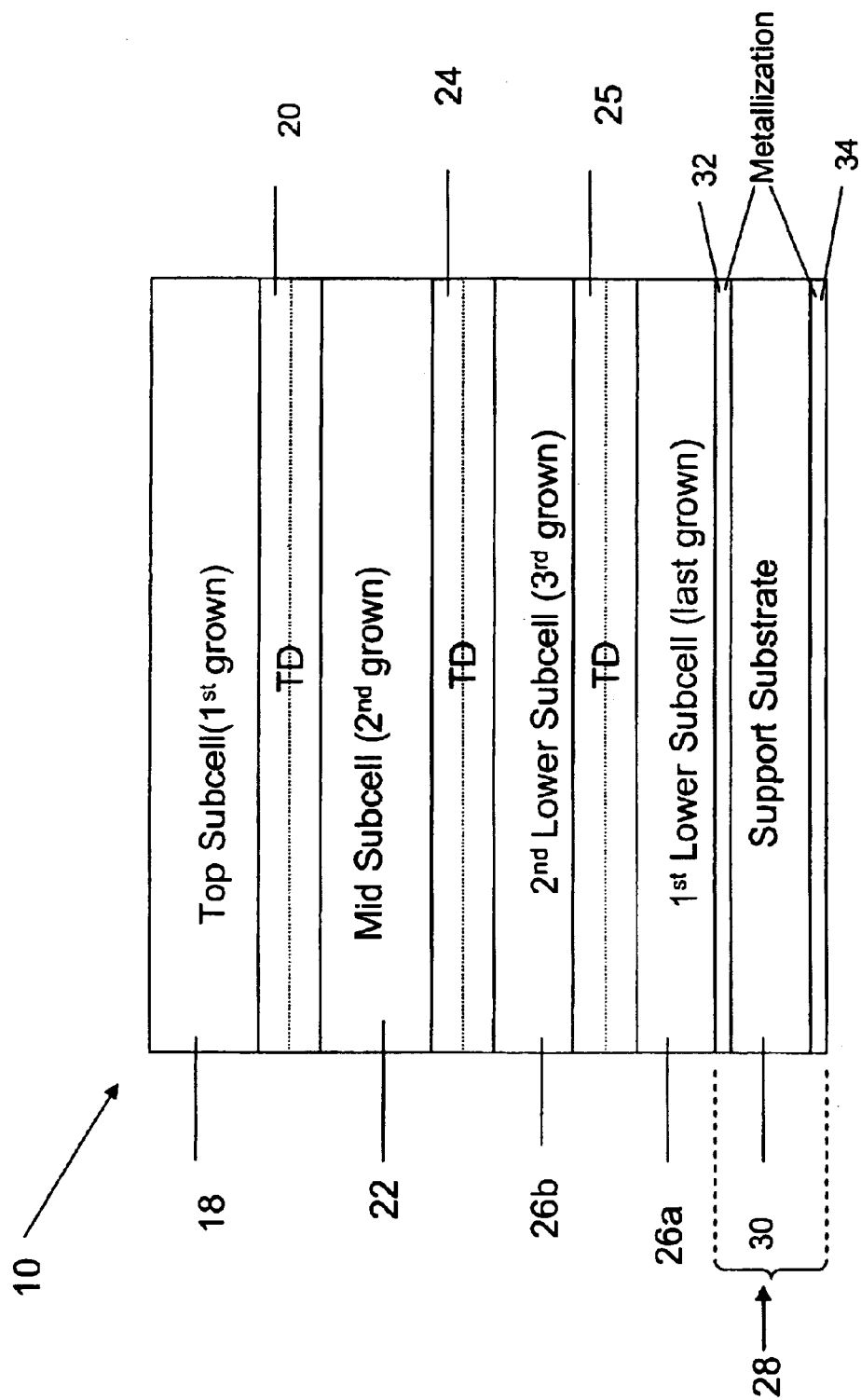
FIG. 9 illustrates one embodiment of a completed multijunction solar cell structure comprising first and second lower subcells.

A wide range of variation in design, structure, and the methods of fabrication are possible. In another embodiment, for example, the cell comprises four subcell materials with band gaps preferably selected to divide the solar spectrum to provide matched current density. FIG. 8 depicts the growth of the subcells including first and second lower subcells 26a, 26b in reverse order. A tunnel diode 25 may also be formed between the pair of lower subcells 26a, 26b. FIG. 9 shows the solar cell 10 with the first and second lower subcells 26a, 26b below the middle and top subcells 22, 18 in the solar cell device. For the AM0 solar spectrum, for example, use of materials with band gaps of approximately 1.80 eV, 1.40 eV, 1.0 eV, and 0.72 eV, respectively, yield a theoretical efficiency at AM0, 28° C. of about 41.5%. This band gap sequence can be obtained by growing the upper, middle, second lower and first lower subcells, 18, 22, 26b, 26a respectively comprising layers of $In_{0.5}Ga_{0.5}P$ (~1.82 eV), $In_xGa_{1-x}As$ (~1.40 eV for x ~0.01), $In_{0.4}Ga_{0.6}As$ (~1.0 eV) and $In_{0.53}Ga_{0.47}As$ (~0.72 eV) on a GaAs or Ge substrate. The upper two subcells 18, 22 (in the completed cell) with higher band gaps are preferably closely matched in lattice-spacing to the growth substrate 14. The lower two subcells 26a, 26b (e.g., $In_{0.4}Ga_{0.6}As$ and $In_{0.53}Ga_{0.47}As$) with lower band gaps may be respectively mismatched to the substrate 14, e.g., by about 2.2% and 4.4%. In contrast, if this structure 10, 12 is grown in order of increasing band gap, the two lower subcells 26a, 26b will have poor quality and performance because of mismatched strains, even if efforts are made to reduce these strains. The upper two subcells 18,

22 will also have reduced performance because of propagation of the lattice strains.

The upper two subcells 18, 22 may account for 75% of the ideal four-cell output. Using reverse growth procedures (growing the upper two subcells 18, 22 first on the substrate 14) can lead to maximum output from the upper two subcells. Subsequent growth of the lower two subcells 26a, 26b with lattice-mismatch preferably will not negatively affect the output of the predominant upper two subcells 18, 22. In addition, the lower two subcells 26a, 26b can be grown using conditions that reduce or minimize the effects of lattice mismatch strains. For example, materials with lattice grading from the mid cell 22 to the second subcell 26b and also from the second lower subcell 26b to first lower subcell 26a may be employed or growth of strained superlattices can be utilized to reduce strains. The reverse growth sequence proposed preferably includes some degree of lattice-grading, e.g., to about 2% and then to about 4% mismatch with respect to the growth substrate 14. Lattice mismatch outside these ranges are also possible. Additionally, specifically tailored or optimized growth temperatures and/or annealing schedules can be used to reduce strain and to increase the performance of the lower two subcells 26a, 26b without substantially affecting the performance of the upper two subcells 18, 22. To further reduce strain effects, the lower two subcells 26a, 26b can be very thin and preferably have a thickness close to critical thickness to reduce or minimize the effects of threading dislocations. Reduced optical absorptance in both these lower subcells 26a, 26b can be largely offset by application of a highly reflecting metal (back surface reflector, BSR) on the last layer grown. The resultant photon recycling may be more effective than growing distributed Bragg reflector layers under the lowest subcell 26. The current density generated in the lower two subcells 26a, 26b can approach the optimum current density in the four subcell stack 12.

Numerous other embodiments of the invention are possible. For example, the reverse growth method described above can be extended to include use of other growth substrates 14, such as, e.g., InP or Si. The methods described herein can also extend to use of other materials for the subcells 18, 22, 26, which may be conditional on or affected by the choice of growth substrate 14. In various embodiments, for example, possibly $Si_{(x)}Ge_{(1-x)}$, with x in the proper range, can be used for the lower subcell 26, along with lattice-matching layers in the $In_{(y)}Ga_{(1-y)}P$ system. For example, x may be about 0.9 for a band gap of between about 0.9 to 1 eV and x may be about 0.6 for a band gap of about 0.7 eV. In other embodiments, materials in the InGaN system, or InGaAsP system may be used.

As discussed above, the reverse growth preferably involves the removal of the growth substrate 14, either by growing layers 16 at the substrate which facilitate removal and subsequent re-use of the substrate, or by removal of the substrate by etching or other techniques. Prior to removal of the growth substrate, structural support is preferably provided to the stack of layers 40.

Figure 10:
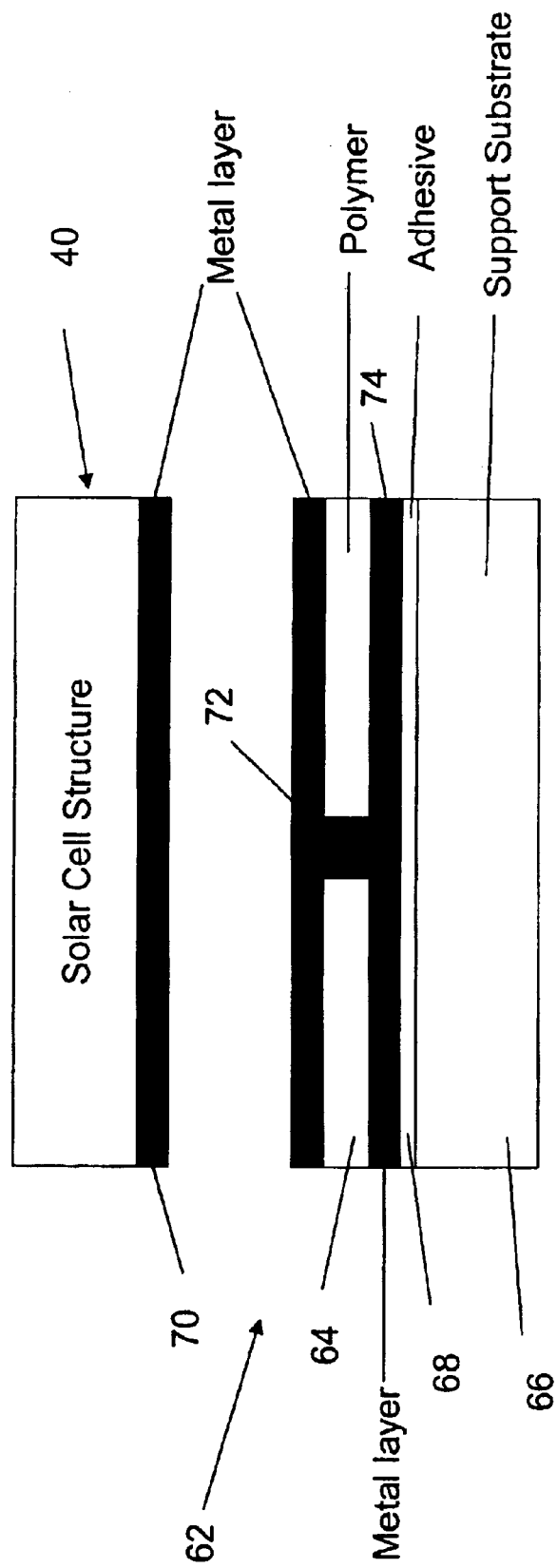
FIG. 10 illustrates a support structure comprising a removable rigid support portion.

FIG. 10 illustrates one embodiment comprising a support structure 62 that includes a support layer 64 affixed to a support substrate 66 by an adhesive layer 68. The support layer 64 is preferably substantially lightweight and may comprise for example a polymer. Alternative materials may be employed as well. This support layer 64 may also be substantially thin. Moreover, in certain embodiments, the support layer 64 may be flexible for example as a result of the thinness and/or the material(s) employed. A thin polymeric material, e.g., teflon, may be use which may be easy to bend and particularly flexible and compliant. This thin polymer sheet 64 may be about 100 micrometers (about 4 mils) thick. The support layer 64 may be thicker or thinner in different embodiments. In one alternative embodiment, the support layer comprises silicon, which can be doped and can provide a conductive path to the metal contact on the stack of subcells 40. The silicon may be metalized on top and bottom as discussed more fully below. Silicon advantageously has a high thermal conductance and can be about 100 to about 150 micrometers (about 4 mils to 6 mils) or thicker or thinner and have good flexibility. Silicon is also relatively lightweight.

The support substrate 66 may comprise semiconductor such as silicon or other semiconductor substrates. Alternatively the support substrate 66 may comprise polymer or other materials as well.

The adhesive may comprise for example an elastomeric polymer. Other types of materials may be used as well to adhere the support layer 64 to the support substrate 66. Preferably, however, the adhesive 68 or other material used to bind the support layer 64 to the support substrate 66 is not permanent such that the support substrate can be readily separated from the support layer. In this manner, the thickness of the support structure 62 can be substantially reduced with the detachment of the support substrate 66.

Prior to removal of the support substrate 64, the support substrate may provide rigid support to allow processing of the cell during removal of the growth substrate 14, and during subsequent deposition of gridded front contacts 42, and an anti-reflecting layer 44. The support substrate 66 may also adds robustness during bonding of electrical contacts, or during interfacing into arrays. The removable support substrate 66 can be subsequently separated from the support layer 64 to reduce the weight of the support structure 62 and of the solar cells 10. Light weight solar cells may be particularly useful for space application where weight is an important consideration. This support structure 62 after removal of the separable portion 66 may be flexible which may be useful for some applications.

As shown in FIG. 10, metallization is included to bond and electrically connect the plurality of subcells 40 to the support structure 62. In particular, layers of metallization 70, 72 are included beneath the lower subcell 26 and on the support layer 64, which may comprise for example polymer. The metal layer 72 deposited on one face of the support structure 62 is bonded to the preferably high reflectance metal layer 70 deposited on the back of, for example, the lowest subcell 26, e.g., on the last surface grown. Preferably, at least, the two metal layers 70, 72 together are substantially reflective. This reflectivity may be about 90% or 95% or higher although the reflectivity may be lower as well and thus other ranges are possible. An exemplary metal filled hole or via is shown through the polymer support layer 64 to another layer of metal 74 below the support layer. The adhesive 68 is shown as being formed on this layer of metal 74 beneath the support layer 64. With removal of the adhesive 68 and the support substrate 66 from the support structure 62, the metal layer 74 is preferably exposed for electrical contact to external electrical connections. Such electrical connection to the solar cell 10 may be formed by, e.g., lead wires or contacts to the layer of metal 74. A coverglass may be placed over the solar cell closer to the upper subcell 18. A 4 mil cover glass may be sufficient in many operating orbits to protect the solar cell from damage caused by bombardment from charged radiation in outer space.

Use of a reverse growth sequence can allow formation of high band gap lattice-matched subcells 18, 22, as well as growth of the appropriate lower band gap materials that are substantially lattice-mismatched to the growth substrate 14 and to the high band gap subcells. The high band gap subcells 18, 22 are therefore preferably substantially unstrained. This reverse growth process permits retention of the high output from the high band gap subcells 18, 22, which provide a substantial majority of the output. The high band gap subcells 18, 22 may, for example, provide about 84% of the output for a three junction cell and about 75% of the output for a four junction cell. The reverse sequence may also reduce strains resulting from lattice-mismatch, e.g., in the lower band gap subcell(s) 26a, 26b. Different growth conditions such as temperature and growth rate, etc. and the growth of approximate lattice-grading materials are possible for the lower band gap subcell(s) 26a, 26b. Accordingly, AM0 efficiencies of about 30% to 40% or more may be obtained. Efficiencies outside this range are also possible. Preferably, however, the upper subcells(s) 18, 22 are sufficiently unstrained and the lower subcell(s) 26a, 26b provide sufficient contribution such that the solar cell has an AM0 conversion efficiency of at least 30%. These conversion efficiencies are preferably achieved at a temperature of about 28° C.

An additional advantage of this approach is that a support structure 28, 62 with high thermal conductance can be bonded to the BSR layer 32, 70 (or may provide the high BSR). By bonding the support structure 28, 62 with highly reflecting metal on the bonded interface, significant recycling of photons not absorbed in the lower band gap materials increase the current generated in the lower subcells 26. The increased efficiency provided by the second pass of the photons through the subcells 18, 22, 26 permits use of much thinner active layers to be grown, e.g., in the lower band gap cells, which reduces lattice strain and may decease the weight of the cell 10. These subcells may for example be about 1 to 3 micrometers thick in some embodiments although the thickness may be outside this range. If the multijunction cells are operated in space (AM0 conditions), the high BSR may reflect most if not all unused photons, thereby lowering the operating temperature of the solar cells in space. In addition, for terrestrial operation at very high concentrations, the support structure 28, 62 may provide an effective heat sink, reducing the cell operating temperature, and maintaining performance. The support structure 28, 62 also allows processing of the cell 40 during removal of the growth substrate 14, and during subsequent deposition of gridded front contacts 42, and an anti-reflecting layer 44. The support structure 28, 62 additionally adds robustness during bonding of electrical contacts, or during interfacing into arrays. This support structure 62 may have a removable portion 66 that can be separated from the support structure reducing the weight of the support structure and of the solar cells 10. This support structure 62 after removal of the separable portion 66 may be flexible which may be useful for some applications. The use of BSR and photon recycling to reduce thickness of layers and thus reduce lattice-mismatch strains may also increase the tolerance of the cell to degradation caused by charged particles in space. The reflectance is preferably not affected by the radiation, and the increased absorption preferably offsets loss of current resulting from radiation damage.

Favorable power-to-weight ratios can be achieved. A comparison is made between the performance of a conventional multijunction cell to a thin multijunction cell on a silicon support structure 62 and a thin multijunction cell on a polymer support structure. The conventional multijunction cell has a thickness of around 150 microns. The thin multijunction cell on a silicon support structure 62 is about 10 microns thick and the silicon support structure is about 100 microns thick. The thin multijunction cell on a polymer support structure 62 is also about 10 microns thick and the polymer support structure is about 100 microns thick. Assuming that each device has the same efficiency and a glass/quartz coverglass about 100 microns thick, then the ratio of power per weight (watts per kilogram) for the three devices is about 1:1.5:2. Increased power per weight is thus achieved with the reduced thickness.

In principle, reverse growth may have advantages in growing other semiconductor devices, where the lower layers require special growth conditions or designs which can be used without lowering the quality of the upper layers.

While certain preferred embodiments of the invention have been described, these embodiments have been presented by way of example only, and are not intended to limit the scope of the present invention. Various modifications and applications may occur to those skilled in the art without departing from the true spirit and scope of the invention as defined in the appended claims.

What is claimed is:

1. A method of forming a multijunction solar cell comprising an upper subcell, a middle subcell, and at least one lower subcell, said method comprising:

providing a growth semiconductor substrate for the epitaxial growth of semiconductor material;

forming said upper subcell over said growth semiconductor substrate such that said upper subcell has a first upper band gap and is substantially lattice-matched to said growth substrate;

forming said middle subcell over said upper subcell such that said middle subcell is substantially lattice-matched to said growth substrate and said middle subcell has a second middle band gap, said first upper band gap being larger than said second middle band gap;

forming said at least one lower subcell over said middle subcell such that said at least one lower subcell is substantially lattice-mismatched with respect to said growth semiconductor substrate and said at least one lower subcell has a third lower band gap, said third lower band gap being smaller than said second middle band gap;

providing a support structure over said lower subcell; and removing said growth semiconductor substrate.

2. The method of claim 1, wherein said lattice mismatch between said lower subcell and said growth semiconductor substrate is about 1% or greater.

3. The method of claim 1, wherein said lattice mismatch between said lower subcell and said growth semiconductor substrate is about 2% or greater.

4. The method of claim 1, wherein said lattice mismatch between said lower subcell and said growth semiconductor substrate is about 4% or greater.

5. The method of claim 1, wherein said lattice mismatch between said lower subcell and said growth semiconductor substrate is about 5% or greater.

6. The method of claim 1, wherein providing a growth semiconductor substrate for epitaxial growth of semiconductor material comprises providing a substrate selected from the group consisting of a GaAs substrate, a Ge substrate, an InP substrate, and a Si substrate.

7. The method of claim 1, wherein forming said upper subcell comprises growing gallium indium phosphide semiconductor material over said semiconductor growth substrate.

8. The method of claim 1, wherein forming said middle subcell comprises growing indium gallium arsenide semiconductor material.

9. The method of claim 1, wherein forming said lower subcell comprises depositing indium gallium arsenide semiconductor material over said middle subcell.

10. The method of claim 1, wherein forming said lower subcell comprises depositing silicon germanium semiconductor material over said middle subcell.

11. The method of claim 1, further comprising forming grading layers between said lower subcell and said middle subcell by growing InGaAs semiconductor material while increasing said In content and decreasing said Ga content to reduce stress in said lower subcell resulting from mismatch of lattice spacing.

12. The method of claim 1, further comprising forming grading layers between said lower subcell and said middle subcell by growing indium gallium arsenide to reduce stress in said lower subcell resulting from mismatch of lattice spacing.

13. The method of claim 1, further comprising reusing said growth semiconductor substrate for epitaxial growth of semiconductor material after said step of removing said growth semiconductor substrate.

14. The method of claim 1, wherein said semiconductor growth substrate is removed by etching the substrate.

15. The method of claim 1, further comprising removing a portion of said support structure thereby reducing the weight of said support structure after removing said growth semiconductor substrate.

16. The method of claim 15, wherein said support structure is formed by adhering a sheet to a rigid member using a non-permanent adhesive such that said rigid member is detachable from said sheet after said support substrate is bonded to said lower subcell and said growth semiconductor substrate is removed.

17. The method of claim 16, wherein one side of said sheet is metallized to provide electrical bonding to said lower subcell and to provide increased reflectance.

18. The method of claim 1, further comprising forming a parting layer between said growth semiconductor substrate and said upper subcell.

19. The method of claim 18, further comprising preferentially etching said parting layer so as to remove said growth semiconductor substrate substantially intact for reuse.

20. The method of claim 1, wherein first and second lower subcells are formed, said first lower subcell having a larger band gap than said second lower subcell.

21. The method of claim 20, wherein said first lower subcell, said second lower subcell, and said middle subcell are formed by growing InGaAs based material and said upper subcell is formed by growing InGaP based material.

22. The method of claim 21, further comprising forming grading layers between said first and second lower subcells by growing InGaAs semiconductor material while increasing said In content and decreasing said Ga content to reduce stress in said lower subcell resulting from mismatch of lattice spacing.

23. A method of forming a multijunction solar cell comprising a high band gap substantially unstrained subcell and at least one lattice-mismatched low band gap subcell, the method comprising:

providing a growth semiconductor substrate for the epitaxial growth of semiconductor material;

forming the high band gap subcell over the growth semiconductor substrate, the high band gap subcell having a first high band gap;

forming the at least one low band gap subcell over the high band gap subcell, the low band gap subcell having a second low band gap, the first high band gap being larger than the second low band gap, said growth substrate and said low band gap subcell having substantial lattice mismatch;

providing a support substrate over the low band gap subcell; and removing the growth semiconductor substrate.

24. The method of claim 23, wherein said lattice mismatch between said low band gap subcell and said growth substrate is at least about 1%.

* * * * *

UNITED STATES PATENT AND TRADEMARK OFFICE
CERTIFICATE OF CORRECTION

| | |
|---|---|
| PATENT NO. | : 6,951,819 B2 |
| APPLICATION NO. | : 10/728103 |
| DATED | : October 4, 2005 |
| INVENTOR(S) | : Iles et al. |

Page 1 of 1

It is certified that error appears in the above-identified patent and that said Letters Patent is hereby corrected as shown below:

In column 1, line 50, please delete "$in_{(x)}Ga_{(1-x)}As$" and insert -- $In_{(x)}Ga_{(1-x)}As$ -- therefore.

Signed and Sealed this

Seventeenth Day of April, 2007

JON W. DUDAS
*Director of the United States Patent and Trademark Office*